(12) United States Patent
Xie et al.

(10) Patent No.: US 11,886,418 B2
(45) Date of Patent: Jan. 30, 2024

(54) METHOD AND APPARATUS FOR IMPROVED BELIEF PROPAGATION BASED DECODING

(71) Applicant: Telefonaktiebolaget LM Ericsson (publ), Stockholm (SE)

(72) Inventors: Ailing Xie, Beijing (CN); Yushi Zhang, Beijing (CN)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 204 days.

(21) Appl. No.: 17/627,161

(22) PCT Filed: Jul. 15, 2019

(86) PCT No.: PCT/CN2019/096025
§ 371 (c)(1),
(2) Date: Jan. 14, 2022

(87) PCT Pub. No.: WO2021/007751
PCT Pub. Date: Jan. 21, 2021

(65) Prior Publication Data
US 2022/0284007 A1 Sep. 8, 2022

(51) Int. Cl.
*G06F 16/23* (2019.01)
(52) U.S. Cl.
CPC .............. *G06F 16/2365* (2019.01)
(58) Field of Classification Search
None
See application file for complete search history.

(56) References Cited

U.S. PATENT DOCUMENTS 11,088,707 B2 * 8/2021 Palangappa ............ G06F 17/16
2015/0333775 A1 11/2015 Korb et al.
(Continued)

FOREIGN PATENT DOCUMENTS

| CN | 104158549 A | 11/2014 |
| CN | 108847848 A | 11/2018 |
| CN | 109831216 A | 5/2019 |

OTHER PUBLICATIONS

Xie, et al., "Belief Propagation Decoding of Polar Codes using Intelligent Post-processing," 3rd Information Technology, Networking, Electronic and Automation Control Conference, Mar. 2019, IEEE, pp. 871-874.
(Continued)

*Primary Examiner* — Kim T Nguyen
(74) *Attorney, Agent, or Firm* — Withrow & Terranova, PLLC

(57) ABSTRACT

Various embodiments of the present disclosure provide methods and apparatuses for improved belief propagation (BP) decoding. A method performed by a receiver comprises: performing BP decoding on received information; obtaining, in response to the BP decoding being unsuccessful and based on a first table comprising left-to-right messages associated with nodes of a plurality of processing elements (PEs) for the BP decoding and the received information, a second table comprising right-to-left messages associated with the nodes; searching, based on the first table and the second table, a conflict verification processing element (VPE); updating, for the conflict VPE, both signs of the right-to-left messages associated with its right-upper node and right-lower node to be the same and the sign of the right-to-left messages associated with its left-upper node to be positive; updating the second table; and performing the BP decoding based on the updated second table.

11 Claims, 11 Drawing Sheets

(56) References Cited

U.S. PATENT DOCUMENTS

2019/0326930 A1* 10/2019 Palangappa ........ H03M 13/1117
2022/0006471 A1* 1/2022 Palangappa ........ H03M 13/1131

OTHER PUBLICATIONS

Yu, et al., "Belief Propagation Bit-Flip Decoder for Polar Codes," IEEE Access, vol. 7, Feb. 2019, pp. 10937-10946.
Extended European Search Report for European Patent Application No. 19937568.4, dated May 24, 2022, 8 pages.
Arikan, Erdal, "Channel Polarization: A Method for Constructing Capacity-Achieving Codes for Symmetric Binary-Input Memoryless Channels," IEEE Transactions on Information Theory, vol. 55, Issue 7, Jul. 2009, pp. 3051-3073.
Arikan, Erdal, "Polar codes: A pipelined implementation," Proceedings of the 4th International Symposium on Broadband Communications, Jul. 2010, 3 pages.
Bioglio, Valerio, et al., "Design of Polar Codes in 5G New Radio," IEEE Communications Surveys & Tutorials, Apr. 2018, 12 pages.
Elkelesh, Ahmed, et al., "Belief Propagation List Decoding of Polar Codes," IEEE Communications Letters, vol. 22, Issue 8, Aug. 2018, pp. 1536-1539.
Intel Corporation, "R1-162387: Channel coding for new radio interface," 3GPP TSG RAN WG1 Meeting #84bis, Apr. 11-15, 2016, Busan, South Korea, 4 pages.
International Search Report and Written Opinion for International Patent Application No. PCT/CN2019/096025, dated Apr. 13, 2020, 9 pages.

* cited by examiner

METHOD AND APPARATUS FOR IMPROVED BELIEF PROPAGATION BASED DECODING

This application is a 35 U.S.C. § 371 national phase filing of International Application No. PCT/CN2019/096025, filed Jul. 15, 2019, the disclosure of which is incorporated herein by reference in its entirety.

FIELD OF THE INVENTION

The present disclosure generally relates to wireless communications, and more specifically, to a method and apparatus for improved belief propagation (BP) based decoding.

BACKGROUND

This section introduces aspects that may facilitate a better understanding of the disclosure. Accordingly, the statements of this section are to be read in this light and are not to be understood as admissions about what is in the prior art or what is not in the prior art.

Polar code has attracted much attention since its birth in 2008. It can achieve Shannon capacity with very simple encoding and decoding. In recently released 3GPP technical specification, polar coding has been adopted as channel coding for a control channel in case of enhanced mobile broadband (eMBB) service. There are two major domains of decoding schemes for polar code: Successive Cancellation (SC) based decoding and Belief Propagation (BP) based decoding.

For the SC based decoding, Successive Cancellation List (SCL) decoding was introduced which can achieve maximum likelihood (ML) bound with sufficiently large list size. For the BP based decoding, Belief Propagation List (BPL) decoding was proposed which can improve performance of the BP decoding.

SUMMARY

This summary is provided to introduce a selection of concepts in a simplified form that are further described below in the detailed description. This summary is not intended to identify key features or essential features of the claimed subject matter, nor is it intended to be used to limit the scope of the claimed subject matter.

The present disclosure proposes an improved BP based decoding solution, which may be referred to as Belief Propagation Conflict Search (BPCS) decoding.

According to a first aspect of the present disclosure, there is provided a method performed by a receiver. The method comprises performing BP decoding on received information. The method also comprises obtaining, in response to the BP decoding being unsuccessful and based on a first table comprising left-to-right messages associated with nodes of a plurality of processing elements for the BP decoding and the received information, a second table comprising right-to-left messages associated with the nodes, and searching, based on the first table and the second table, a conflict verification processing element in the plurality of processing elements. The conflict verification processing element is a verification processing element for which the left-to-right messages associated with the most-left nodes affecting the left-to-right message associated with its left-upper node indicate frozen bits and the left-to-right messages associated with the most-left nodes affecting the left-to-right message associated with its left-lower node indicate frozen bits and information bits, and has a negative sign for the right-to-left message associated with its left-upper node. The method also comprises updating, for the conflict verification processing element, both signs of the right-to-left messages associated with its right-upper node and right-lower node to be the same and the sign of the right-to-left messages associated with its left-upper node to be positive, updating the second table based on the updating of the conflict verification processing element, and performing the BP decoding based on the updated second table.

In accordance with an exemplary embodiment, the method may further comprise searching, in response to the BP decoding based on the updated second table being unsuccessful, another conflict verification processing element.

In accordance with an exemplary embodiment, the method may further comprise changing, in response to the BP decoding based on the updated second table being unsuccessful and no other conflict verification processing element being found, the both signs of the right-to-left messages associated with the right-upper node and right-lower node of at least one conflict verification processing element. Further, the changed signs may be the same and opposite to the signs before the changing.

In accordance with an exemplary embodiment, the left-to-right message and the right-to-left message may be in the form of logarithmic likelihood ratio, LLR.

In accordance with an exemplary embodiment, the left-to-right message in the first table may be calculated as follows:

$$R_{i+1,j0}=f(R_{i,j2},R_{i,j3}),$$

$$R_{i+1,j1}=R_{i,j3},$$

$$f(a,b)=\text{sign}(a*b)*\min(|a|,|b|),$$

where $R_{i+1,j0}$ represents the left-to-right message associated with the right-upper node of the processing element, $R_{i+1,j1}$ represents the left-to-right message associated with the right-lower node of the processing element, $R_{i,j2}$ represents the left-to-right message associated with the left-upper node of the processing element, and $R_{i,j3}$ represents the left-to-right message associated with the left-lower node of the processing element. Further, the left-to-right messages associated with the most-left nodes may be set based on bit positions of information bits and frozen bits in a source bit sequence from which the received information is originated. The left-to-right message associated with the most-left node indicating the information bit may be set to a first value and the left-to-right message associated with the most-left node indicating the frozen bit may be set to a second value.

In accordance with an exemplary embodiment, the right-to-left message in the second table may be calculated as follows:

$$L_{i,j2}=f(R_{i,j3}+L_{i+1,j1}L_{i+1,j0}),$$

$$L_{i,j3}=f(R_{i,j2},L_{i+1,j0})+L_{i+1,j1},$$

$$f(a,b)=\text{sign}(a*b)*\min(|a|,|b|),$$

where $L_{i,j2}$ represents the right-to-left message associated with the left-upper node of the processing element, $L_{i,j3}$ represents the right-to-left message associated with the left-lower node of the processing element, $L_{i+1,j0}$ represents the right-to-left message associated with the right-upper node of the processing element, and $L_{i+1,j1}$ represents the right-to-left message associated with the right-lower node of the processing element. Further, the right-to-left messages associated with the most-right nodes may be set to the received information.

In accordance with an exemplary embodiment, searching the conflict verification processing element in the plurality of processing elements may comprise checking, for each of the plurality processing elements based on the first table, the left-to-right messages associated with the left-upper node and the left-lower node, determining the processing element of which the left-to-right message associated with its left-upper node has a larger value than the left-to-right message associated with its left-lower node as a verification processing element, checking, for the verification processing element based on the second table, whether the right-to-left message associated with the left-upper node has a negative sign, and determining, in response to the right-to-left message associated with the left-upper node having the negative sign, the verification processing element as the conflict verification processing element.

In accordance with an exemplary embodiment, the searching of the verification processing element may be performed starting from the most-right processing element.

In accordance with an exemplary embodiment, updating, for the conflict verification processing element, both signs of the right-to-left messages associated with its right-upper node and right-lower node to be the same and the sign of the right-to-left messages associated with its left-upper node to be positive may comprise comparing absolute values of the right-to-left messages associated with the right-upper node and right-lower node of the conflict verification processing element, changing the both signs of the right-to-left messages associated with the right-upper node and right-lower node of the conflict verification processing element to be same as the sign of the right-to-left message which has the larger absolute value, and changing the sign of the right-to-left messages associated with its left-upper node to be positive.

In accordance with an exemplary embodiment, updating the second table based on the updating of the conflict verification processing element may comprise updating the right-to-left messages associated with the nodes of the processing elements which are connected leftwards to the conflict verification processing element.

According to a second aspect of the present disclosure, there is provided a receiver. The receiver may comprise one or more processors and one or more memories comprising computer program codes. The one or more memories and the computer program codes may be configured to, with the one or more processors, cause the receiver at least to perform any step of the method according to the first aspect of the present disclosure.

According to a third aspect of the present disclosure, there is provided a receiver. The receiver may comprise a BP decoder configured to perform BP decoding on received information, and a BP conflict search circuitry configured to obtain, in response to the BP decoding being unsuccessful and based on a first table comprising left-to-right messages associated with nodes of a plurality of processing elements for the BP decoding and the received information, a second table comprising right-to-left messages associated with the nodes; search, based on the first table and the second table, a conflict verification processing element in the plurality of processing elements, the conflict verification processing element being a verification processing element for which the left-to-right messages associated with the most-left nodes affecting the left-to-right message associated with its left-upper node indicate frozen bits and the left-to-right messages associated with the most-left nodes affecting the left-to-right message associated with its left-lower node indicate frozen bits and information bits, and having a negative sign for the right-to-left message associated with its left-upper node; update, for the conflict verification processing element, both signs of the right-to-left messages associated with its right-upper node and right-lower node to be the same and the sign of the right-to-left messages associated with its left-upper node to be positive; and update the second table based on the updating of the conflict verification processing element. The BP decoder is further configured to perform the BP decoding based on the updated second table.

According to a fourth aspect of the present disclosure, there is provided a computer-readable medium having computer program codes embodied thereon which, when executed on a computer, cause the computer to perform any step of the method according to the first aspect of the present disclosure.

BRIEF DESCRIPTION OF THE DRAWINGS

The disclosure itself, the preferable mode of use and further objectives are best understood by reference to the following detailed description of the embodiments when read in conjunction with the accompanying drawings, in which.

DETAILED DESCRIPTION

Figure 1:
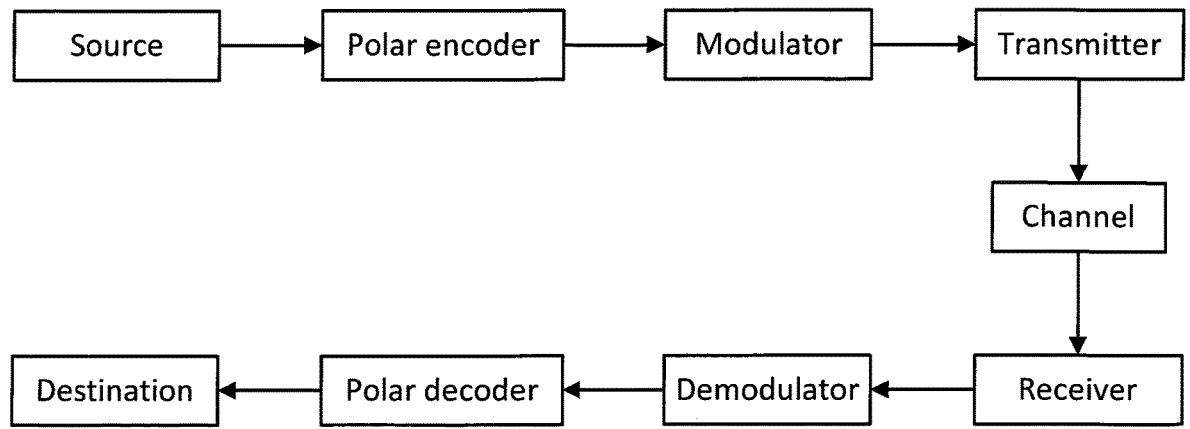
FIG. 1 is a diagram of a communication system in which polar code is implemented.

The embodiments of the present disclosure are described in detail with reference to the accompanying drawings. It should be understood that these embodiments are discussed only for the purpose of enabling those skilled persons in the art to better understand and thus implement the present disclosure, rather than suggesting any limitations on the scope of the present disclosure. Reference throughout this specification to features, advantages, or similar language does not imply that all of the features and advantages that may be realized with the present disclosure should be or are in any single embodiment of the disclosure. Rather, language referring to the features and advantages is understood to mean that a specific feature, advantage, or characteristic described in connection with an embodiment is included in at least one embodiment of the present disclosure. Furthermore, the described features, advantages, and characteristics of the disclosure may be combined in any suitable manner in one or more embodiments. One skilled in the relevant art will recognize that the disclosure may be practiced without one or more of the specific features or advantages of a particular embodiment. In other instances, additional features and advantages may be recognized in certain embodiments that may not be present in all embodiments of the disclosure.

As used herein, the term "communication network" refers to a network following any suitable communication standards, such as new radio (NR), long term evolution (LTE), LTE-Advanced, wideband code division multiple access (WCDMA), high-speed packet access (HSPA), and so on. Furthermore, the communications between a terminal device and a network node in the communication network may be performed according to any suitable generation communication protocols, including, but not limited to, the first generation (G), the second generation (2G), 2.5G, 2.75G, the third generation (3G), 4G, 4.5G, 5G communication protocols, and/or any other protocols either currently known or to be developed in the future.

The term "network node" refers to a network device in a communication network via which a terminal device accesses to the network and receives services therefrom. The network node or network device may refer to a base station (BS), an access point (AP), a multi-cell/multicast coordination entity (MCE), a controller or any other suitable device in a wireless communication network. The BS may be, for example, a node B (NodeB or NB), an evolved NodeB (eNodeB or eNB), a next generation NodeB (gNodeB or gNB), an IAB node, a remote radio unit (RRU), a radio header (RH), a remote radio head (RRH), a relay, a low power node such as a femto, a pico, and so forth.

Yet further examples of the network node comprise multi-standard radio (MSR) radio equipment such as MSR BSs, network controllers such as radio network controllers (RNCs) or base station controllers (BSCs), base transceiver stations (BTSs), transmission points, transmission nodes, positioning nodes and/or the like. More generally, however, the network node may represent any suitable device (or group of devices) capable, configured, arranged, and/or operable to enable and/or provide a terminal device access to a wireless communication network or to provide some service to a terminal device that has accessed to the wireless communication network.

The term "terminal device" refers to any end device that can access a communication network and receive services therefrom. By way of example and not limitation, the terminal device may refer to a user equipment (UE), or other suitable devices. The UE may be, for example, a subscriber station, a portable subscriber station, a mobile station (MS) or an access terminal (AT). The terminal device may include, but not limited to, portable computers, image capture terminal devices such as digital cameras, gaming terminal devices, music storage and playback appliances, a mobile phone, a cellular phone, a smart phone, a tablet, a wearable device, a personal digital assistant (PDA), a vehicle, and the like.

As yet another specific example, in an Internet of things (IoT) scenario, a terminal device may also be called an IoT device and represent a machine or other device that performs monitoring, sensing and/or measurements etc., and transmits the results of such monitoring, sensing and/or measurements etc. to another terminal device and/or a network equipment. The terminal device may in this case be a machine-to-machine (M2M) device, which may in a 3rd generation partnership project (3GPP) context be referred to as a machine-type communication (MTC) device.

As one particular example, the terminal device may be a UE implementing the 3GPP narrow band Internet of things (NB-IoT) standard. Particular examples of such machines or devices are sensors, metering devices such as power meters, industrial machinery, or home or personal appliances, e.g. refrigerators, televisions, personal wearables such as watches etc. In other scenarios, a terminal device may represent a vehicle or other equipment, for example, a medical instrument that is capable of monitoring, sensing and/or reporting etc. on its operational status or other functions associated with its operation.

As used herein, the terms "first", "second" and so forth refer to different elements. The singular forms "a" and "an" are intended to include the plural forms as well, unless the context clearly indicates otherwise. The terms "comprises", "comprising", "has", "having", "includes" and/or "including" as used herein, specify the presence of stated features, elements, and/or components and the like, but do not preclude the presence or addition of one or more other features, elements, components and/or combinations thereof. The term "based on" is to be read as "based at least in part on". The term "one embodiment" and "an embodiment" are to be read as "at least one embodiment". The term "another embodiment" is to be read as "at least one other embodiment". Other definitions, explicit and implicit, may be included below.

As described above, the SC based decoding and the BP based decoding are main decoding schemes for polar code. The SCL decoding with Cyclic Redundancy Check (CRC) can performs better. However, the SCL decoding is to decode with serial characteristic and high complexity, which would lead to high decoding latency and reduced decoding throughput. On the other hand, the BP based decoding can be easily parallelized. Moreover, with enabled characteristic of soft-in/soft-out decoding, the BP based decoding could joint iterative detection and decoding. Therefore, the BP based decoding can satisfy requirements of low latency and high data rate. But the performance of the BP based decoding is not as good as that of the SCL decoding with CRC.

Therefore, it is desirable to provide an improved BP based decoding scheme to achieve better performance, low latency and parallel computing.

In accordance with some exemplary embodiments, the present disclosure provides improved solutions for the BP based decoding, i.e. BPCS decoding. These solutions may be applied to a receiver in a communication network. The receiver may be implemented in a terminal device or a network node in the communication network. With the improved solutions, the receiver can implement parallel computing for decoding to reduce the decoding latency and improve the decoding performance, thereby reducing decoding complexity and computational power and increasing system capacity.

It is noted that some embodiments of the present disclosure are mainly described in relation to 5G specifications being used as non-limiting examples for certain exemplary network configurations and system deployments. As such, the description of exemplary embodiments given herein specifically refers to terminology which is directly related thereto. Such terminology is only used in the context of the presented non-limiting examples and embodiments, and does not limit the present disclosure naturally in any way. Rather, any other system configuration or radio technologies may equally be utilized as long as exemplary embodiments described herein are applicable.

FIG. 1 shows a communication system in which polar code is implemented. As shown in FIG. 1, a source may obtain K information bits from a higher layer and transfer them to a polar encoder. The polar encoder may add frozen bits into the information bits to generate an (N, K) polar code (which is an N bit sequence) and send the polar code to a modulator. The modulator may select a digital or analog waveform with respect to the polar code and send the waveform to a transmitter. The transmitter may convert the waveform to a signal with a specific radio frequency and power. After transmitted through a wireless channel, such as an additive white Gaussian noise (AWGN) channel, the signal is captured in a receiver. The receiver may convert the signal to the waveform with proper digitalization. Then a demodulator may extract the polar code from the waveform, and generate a hard or soft value. A polar decoder may retrieve the value from the demodulator and correct errors occurring in transmission by a decoding scheme, then transfer the estimated information bits to a destination. In most cases, the destination may use cyclic redundancy check (CRC) to check the correctness of the information bits.

Figure 2:
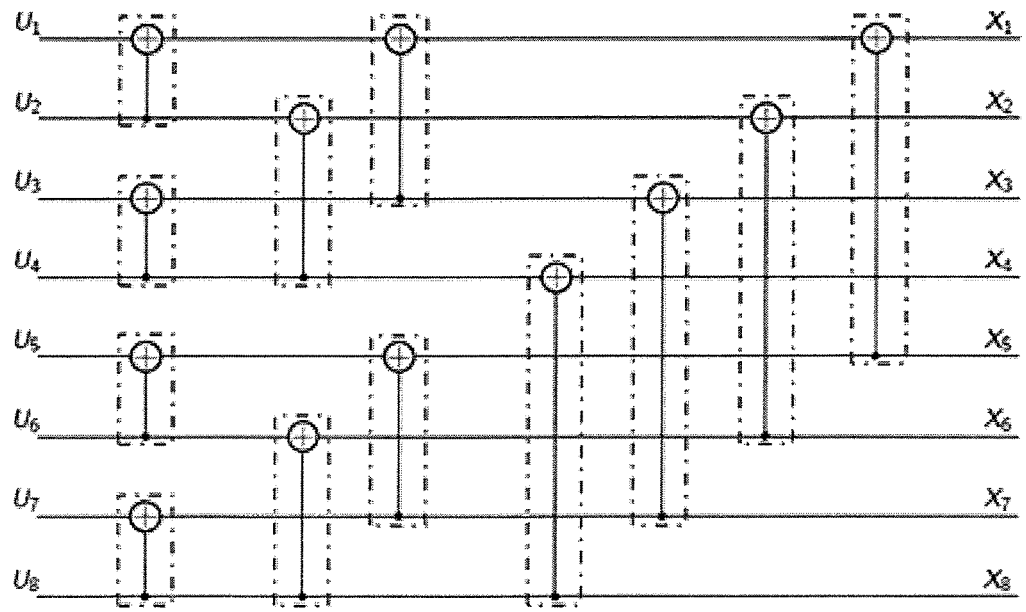
FIG. 2 is a diagram illustrating 8-bit polar code construction.

FIG. 2 shows an example graph of 8-bit polar code construction which may be implemented in the polar encoder in FIG. 1. The 8-bit polar code construction is constituted by several $F_2$ kernels. The $F_2$ kernel is a mapping $F_2$: U→X such that $(u_1, u_2) \rightarrow (u_1 \oplus u_2, u_2)$, where $\oplus$ represents an addition modulo-2 or XOR operation. With this construction, for an (N, K) polar code, K bits transfer more reliably and are used to transfer information bits, and (N−K) bits transfer less reliably and are used to transfer frozen bits. Bit positions of the information bits and frozen bits in a bit sequence can be expressed by a vector I as follows:

$$I_k = \begin{cases} 0 & \text{if } k \text{ is frozen bit} \\ 1 & \text{if } k \text{ is information bit} \end{cases}$$

where $1 \leq k \leq N$. In FIG. 2, N=8 and K=4, the vector I=[0, 0, 0, 1, 0, 1, 1, 1] which indicates that the first, second, third and fifth bits are frozen bits, and the fourth, sixth, seventh and eighth bits are information bits. The generated (8, 4) polar code may be transmitted after modulation in a signal to a receiver. In the receiver, the demodulator may demodulate the received signal and provide the demodulated information to the polar decoder for decoding. As noise exists in the transmission, the received signal may contain the noise.

Figure 3:
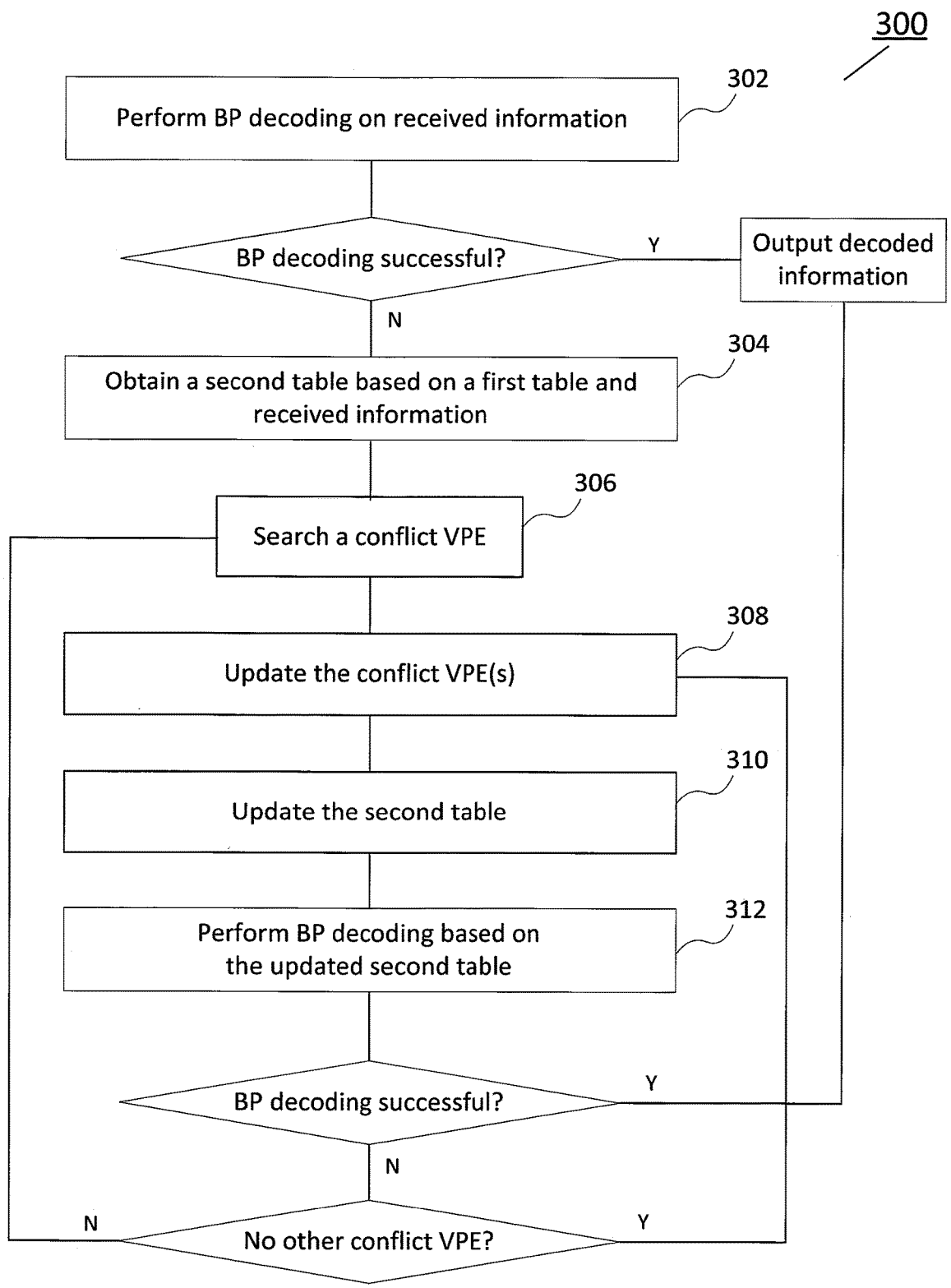
FIG. 3 is a flowchart illustrating a method performed by a receiver according to some embodiments of the present disclosure.

FIG. 3 is a flowchart illustrating a method 300 according to some embodiments of the present disclosure. The method 300 illustrated in FIG. 3 may be performed by an apparatus implemented in or communicatively coupled to a receiver. In some embodiments, the receiver may be implemented in a terminal device or a network node. In accordance with an exemplary embodiment, the terminal device may be a UE, and the network node may be a gNB.

According to the exemplary method 300 illustrated in FIG. 3, the receiver performs belief propagation, BP, decoding on received information, as shown in block 302. In some embodiments, the received information is the information obtained after demodulating a received signal for the decoding. As the received signal may contain the noise, the received information may contain a polar code and the noise. Moreover, the bit positions of the information bits and frozen bits in the polar code can be known.

Figure 4:
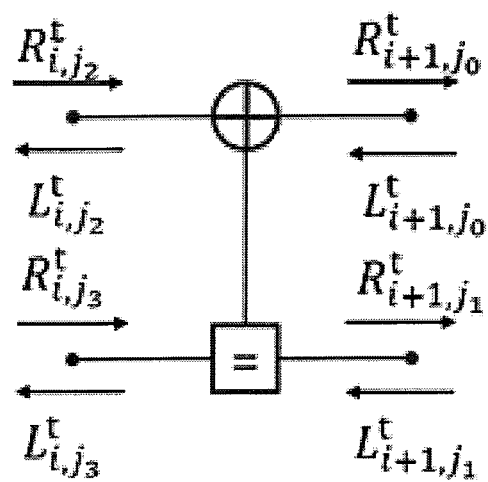
FIG. 4 is a diagram illustrating a processing element (PE) for the BP decoding.

To better understand the embodiments of the present disclosure, the conventional BP decoding will be first described in detail. The BP decoding may involve a plurality of processing elements (PEs). The PE is shown in FIG. 4. The BP decoding for an (N, K) polar code (where $N=2^m$) is based on an m-stage factor graph, which comprise $N*(m+1)$ nodes. As shown in FIG. 4, the PE generally comprises four nodes, i.e. left-upper node $(i, j_2)$, left-lower node $(i, j_3)$, right-upper node $(i+1, j_0)$, and right-lower node $(i+1, j_1)$, where i indicates a column in which the node is located in the factor graph. In FIG. 2, the PE is shown in a dashed block. Each node is associated with a left-to-right message denoted as R and a right-to-left message denoted as L. The left-to-right message and the right-to-left message may be in the form of logarithmic likelihood ratio (LLR). At t-th iteration, the left-to-right message R and the right-to-left message L can be calculated as follows:

$$R_{i+1,j_0}^t = f(R_{i,j_2}^t, R_{i,j_3}^t + L_{i+1,j_1}^{t-1}) \tag{1}$$

$$R_{i+1,j_1}^t = R_{i,j_3}^t + f(R_{i,j_2}^t, L_{i+1,j_0}^{t-1}) \tag{2}$$

$$L'_{i,j_2} = f(R'_{i,j_3} + L'_{i+1,j_1}, L'_{i+1,j_0}) \tag{3}$$

$$L'_{i,j_3} = f(R'_{i,j_2}, L'_{i+1,j_0}) + L'_{i+1,j_1} \tag{4}$$

$$f(a,b) = \text{sign}(a*b)*\min(|a|,|b|)$$

where $R_{i+1,j0}$ and $L_{i+,j0}$ represent the left-to-right message and the right-to-left message associated with the right-upper node $(i+1, j_0)$ respectively, $R_{i+1,j1}$ and $L_{i+1,j1}$ represent the left-to-right message and the right-to-left message associated with the right-lower node $(i+1, j_1)$ respectively, $R_{i,j2}$ and $L_{i,j2}$ represent the left-to-right message and the right-to-left message associated with the left-upper node $(i, j_2)$ respectively, $R_{i,j3}$ and $L_{i,j3}$ represent the left-to-right message and the right-to-left message associated with the left-lower node $(i, j_3)$ respectively. All the right-to-left messages L associated with the nodes in the factor graph for the polar code form an L table with size $N*(m+1)$, and the left-to-right messages R associated with the nodes form an R table with size $N*(m+1)$.

In the BP decoding process, firstly an initialization of the R table and L table may be performed to obtain $R^0$ table and $L^0$ table. In $R^0$ table, the left-to-right messages associated with the most-left nodes may be set based on the bit positions of the information bits and frozen bits as indicated by the vector I. For the most-left node indicating the information bit, the associated left-to-right message may be set to a first value. For the most-left node indicating the frozen bit, the associated left-to-right message may be set to a second value. In an embodiment, the first value and the second value are the LLR values calculated based on the information bit and frozen bit. Other left-to-right messages in $R^0$ table will be set to all zero. With respect to the (8,4) polar code in FIG. 2, $R^0$ table may be expressed as:

| | | | |
|---|---|---|---|
| inf. | 0 | 0 | 0 |
| inf. | 0 | 0 | 0 |
| inf. | 0 | 0 | 0 |
| 0 | 0 | 0 | 0 |
| inf. | 0 | 0 | 0 |
| 0 | 0 | 0 | 0 |
| 0 | 0 | 0 | 0 |
| 0 | 0 | 0 | 0 |

In $R^0$ table as above, the first value is calculated as 0 and the second value is calculated as infinite (denoted as inf.).

In $L^0$ table, the right-to-left messages associated with the most-right nodes may be set to the received information X. As the right-to-left messages and the left-to-right messages use the LLR values, the received information X needs to be transformed to the LLR values. Generally, the transformation of the received information X is based on an LLR formula as follows:

$$L(x) = \log \frac{P(x=0\,|\,y)}{P(x=1\,|\,y)},$$

where y represents the received information, x represents a transferred bit, and L(x) represents the LLR value. Other right-to-left messages in $L^0$ table may be set to all zero. For example, $L^0$ table may be expressed as:

| | | | |
|---|---|---|---|
| 0 | 0 | 0 | $X_1$ |
| 0 | 0 | 0 | $X_2$ |
| 0 | 0 | 0 | $X_3$ |
| 0 | 0 | 0 | $X_4$ |
| 0 | 0 | 0 | $X_5$ |
| 0 | 0 | 0 | $X_6$ |
| 0 | 0 | 0 | $X_7$ |
| 0 | 0 | 0 | $X_8$ |

Then R table and L table may be updated. In each iteration, R table may be calculated from the most-left nodes to the most-right nodes based on equations (1) and (2). Each time when calculating the R table, the left-to-right messages associated with the most-left nodes keep unchanged. Then L table may be calculated from the most-right nodes to the most-left nodes based on equations (3) and (4). Each time when calculating the L table, the right-to-left messages associated with the most-right nodes keep unchanged.

In the first iteration to calculate $R^1$ table, as all the left-to-right messages except the left-to-right messages associated with the most-left nodes are 0 in $L^0$ table, the equations (1) and (2) could be simplified as $R_{i+1,j_0}{}^1 = f(R_{i,j_2}{}^1, R_{i,j_3}{}^1 + L_{i+1,j_1}{}^0) = f(R_{i,j_2}{}^1, R_{i,j_3}{}^1)$ $R_{i+1,j_1}{}^1 = R_{i,j_3}{}^1 + f(R_{i,j_2}{}^1, L_{i+1,j_0}{}^0) = R_{i,j_3}{}^1$ Therefore, in the above example, $R^1$ table (which corresponds to "first table" in claims) may be calculated as:

| | | | |
|---|---|---|---|
| inf. | inf. | 0 | 0 |
| inf. | inf. | 0 | 0 |
| inf. | 0 | 0 | 0 |
| 0 | 0 | 0 | 0 |
| inf. | 0 | 0 | 0 |
| 0 | 0 | 0 | 0 |
| 0 | 0 | 0 | 0 |
| 0 | 0 | 0 | 0 |

At the end of each iteration, the right-to-left messages associated with the most-left nodes in L table may decide the decoded information bits û. The decoded information bits û may be decided as:

$$\hat{u}_k = \begin{cases} 0 & L_{1k} \geq 0 \\ 1 & L_{1k} < 0 \end{cases}, \text{ where } I_k = 1$$

If the decoded information bits û pass the CRC, the BP decoding will be considered as being successful, and the decoded information bits û are provided to the destination. If the decoded information bits û do not pass the CRC and iteration times do not exceed a preset maximum iteration time, the BP decoding process continues to calculate R table and L table. If the decoded information bits û do not pass the CRC and the iteration times exceed a preset maximum iteration time, or if the current L table is same as the previous L table and no decoded information bits û pass the CRC, the BP decoding will be considered as being unsuccessful.

Returning back to FIG. 3, if the BP decoding is unsuccessful, the receiving apparatus obtains a second table based on the first table (i.e. $R^1$ table) and the received information, as shown in block 304. In some embodiments, the second table may be $L^1$ table. As described above, $L^1$ table may be obtained based on the equations (3) and (4). In $L^1$ table, the right-to-left messages associated with the most-right nodes are set to the received information in the form of LLR.

Then, in block 306, the receiver searches a conflict verification processing element in the plurality of PEs, based on the first table $R^1$ and second table $L^1$. In some embodiments, the conflict verification processing element is a kind of PE which satisfies certain conditions.

Firstly, the conflict verification processing element shall be a verification processing element (VPE). With reference to $R^1$ table as above, there are three possible situations for the left-to-right messages $R_{i,j_2}{}^1$, $R_{i,j_3}{}^1$ associated with the left-upper node $(i, j_2)$ and the left-lower node $(i, j_3)$, i.e., [inf. inf.], [inf. 0], and [0, 0]. Correspondingly, the left-to-right messages $R_{i+1,j_0}{}^1$ and $R_{i+1,j_1}{}^1$ associated with the right-upper node $(i+1, j_0)$ and the right-lower node $(i+1, j_1)$ may be [inf. inf.], [0 0], and [0 0]. Table 1 shows the possible situations for the left-to-right messages $R_{i,j_2}{}^1$ and $R_{i,j_3}{}^1$.

TABLE 1

| [$R_{i,j_2}{}^1$ $R_{i,j_3}{}^1$] | [$R_{i+1,j_0}{}^1$ $R_{i+1,j_1}{}^1$] | Characteristics |
|---|---|---|
| [inf. inf.] | [inf. inf.] | The information of bits at the nodes $(i, j_2)$, $(i, j_3)$, $(i + 1, j_0)$ and $(i + 1, j_1)$ are all known, and $L_{i,j_2}{}^1$, $L_{i,j_3}{}^1$, $L_{i+1,j_0}{}^1$ and $L_{i+1,j_1}{}^1$ are all have positive signs. |

TABLE 1-continued

| $[R_{i,j_2}^1 \ R_{i,j_3}^1]$ | $[R_{i+1,j_0}^1 \ R_{i+1,j_1}^1]$ | Characteristics |
|---|---|---|
| [inf. 0] | [0 0] | The information of bit at the node $(i, j_2)$ is known but the information of bits at the node $(i, j_3)$, $(i + 1, j_0)$ and $(i + 1, j_1)$ are unknown. In this situation, the signs of $L_{i,j_3}^1$, $L_{i+1,j_0}^1$ and $L_{i+1,j_1}^1$ are not certain, which may cause the sign of $L_{i,j_2}^1$ to be negative. But the sign of $L_{i,j_2}^1$ should be positive essentially. |
| [0 0] | [0 0] | The information of bits at the nodes $(i, j_2)$, $(i, j_3)$, $(i + 1, j_0)$ and $(i + 1, j_1)$ are all unknown, and the signs of $L_{i,j_2}^1$, $L_{i,j_3}^1$, $L_{i+1,j_0}^1$ and $L_{i+1,j_1}^1$ are not certain. |

In Table 1, for the situation that $[R_{i,j_2}^1 \ R_{i,j_3}^1]$ is [inf. 0], the sign of the right-to-left message $L_{i,j_2}^1$ should be positive and the signs of the right-to-left messages $L_{i+1,j_0}^1$ and $L_{i+1,j_1}^1$ should be the same. Such information may be used to verify whether the PE is correct. Therefore, the PE with the left-to-right messages $[R_{i,j_2}^1 \ R_{i,j_3}^1 \ R_{i+1,j_0}^1 \ R_{i+1,j_1}^1]$ as [inf. 0 0 0] is defined as the VPE.

In some embodiments, the VPE may satisfy that, in $R^1$ table, the left-to-right messages associated with the most-left nodes affecting the left-to-right message $R_{i,j_2}^1$ associated with its left-upper node $(i, j_2)$ indicate frozen bits and the left-to-right messages associated with the most-left nodes affecting the left-to-right message $R_{i,j_3}^1$ associated with its left-lower node $(i, j_3)$ indicate frozen bits and information bits. That is, if the most-left nodes for which the left-to-right messages are used for the calculation of the left-to-right message associated with the left-upper node of the PE indicate the frozen bits only, and if the most-left nodes for which the left-to-right messages are used for the calculation of the left-to-right message associated with the left-lower node of the PE indicate both the frozen bits and the information bits, the PE is the VPE.

Further, the conflict VPE may have a negative sign for the right-to-left message $L_{i,j_2}^1$ associated with its left-upper node $(i, j2)$ in $L^1$ table. In the VPE, the right-to-left messages $L_{i,j_2}^1$ and $L_{i,j_3}^1$ may be calculated as:

$$L_{i,j_2}^1 = f(R_{i,j_3}^1 + L_{i+1,j_1}^1, L_{i+1,j_0}^1) = f(L_{i+1,j_0}^1, L_{i+1,j_1}^1)$$

$$L_{i,j_3}^1 = f(R_{i,j_2}^1, L_{i+1,j_0}^1) + L_{i+1,j_1}^1 = L_{i+1,j_0}^1 + L_{i+1,j_1}^1$$

Therefore, if the signs of the right-to-left messages $L_{i+1,j_0}^1$ and $L_{i+1,j_1}^1$ are opposite, the sign of the right-to-left messages $L_{i,j_2}^1$ is to be negative. Therefore, the VPE with the negative $L_{i,j_2}^1$ is defined as the conflict VPE.

In some embodiments, in the searching of the conflict VPE, the receiver may check the left-to-right messages $R_{i,j_2}^1$ and $R_{i,j_3}^1$ associated with the left-upper node $(i, j_2)$ and the left-lower node $(i, j_3)$ of each PE, based on $R^1$ table. If a PE satisfies that the left-to-right message $R_{i,j_2}^1$ has a larger value than the left-to-right message $R_{i,j_3}^1$ this PE may be determined as the VPE. Then for the VPE, the receiver may check whether the right-to-left message $L_{i,j_2}^1$ associated with the left-upper node $(i, j_2)$ has a negative sign based on $L^1$ table. If the right-to-left message $L_{i,j_2}^1$ has the negative sign, the VPE may be determined as the conflict VPE. If the right-to-left message $L_{i,j_2}^1$ has the positive sign, it indicates that the VPE is not the conflict VPE, and the receiver may continue to check the next VPE until find the conflict VPE. In some embodiments, the searching of the conflict VPE may be performed from the most-right PE.

Figure 5:
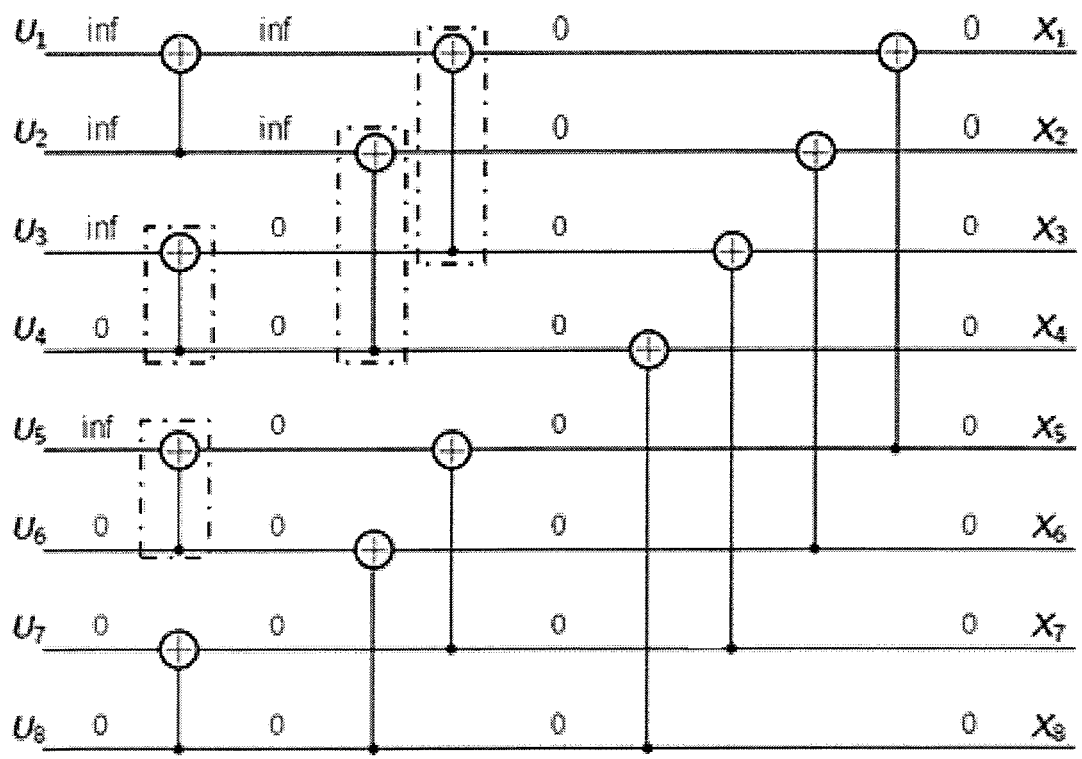
FIG. 5 is a diagram illustrating an example factor graph according to some embodiments of the present disclosure.

FIG. 5 illustrates an example factor graph of the (8, 4) polar code. In this example, assume that the vector I of the (8, 4) polar code is [0, 0, 0, 1, 0, 1, 1, 1]. Therefore, the first, second, third and fifth bits are frozen bits, and the left-to-right messages associated with the nodes (1, 1), (1, 2), (1, 3) and (1, 5) are set to inf. in $R^0$ table. Moreover, the fourth, sixth, seventh and eighth bits are information bits, and the left-to-right messages associated with the nodes (1, 4), (1, 6), (1, 7) and (1, 8) are set to 0 in $R^0$ table. According to the equations (1) and (2), $R^1$ table can be obtained and shown in FIG. 5. Referring to FIG. 5, there are four VPEs shown in a dashed block. Then based on $L^1$ table, the conflict VPE may be determined from the four VPEs.

Once the conflict VPE is determined, in block 308, the receiver updates the signs of the right-to-left messages $L_{i+1,j_0}^1$, $L_{i+1,j_1}^1$ and $L_{i,j_2}^1$ associated with the right-upper node $(i+1, j_0)$, the right-lower node $(i+1, j_1)$ and the left-upper node $(i, j_2)$ of the conflict VPE in $L^1$ table. In some embodiments, both signs of the right-to-left messages $L_{i+1,j_0}^1$ and $L_{i+1,j_1}^1$ may be changed to be the same, e.g. both positive or both negative. The sign of the right-to-left message $L_{i,j_2}^1$ may be changed to be positive.

In some embodiments, the receiver may compare absolute values of the right-to-left messages $L_{i+1,j_0}^1$ and $L_{i+1,j_1}^1$ associated with the right-upper node $(i+1, j_0)$ and right-lower node $(i+1, j_1)$ of the conflict VPE. Then the receiver may change the signs of the right-to-left messages $L_{i+1,j_0}^1$ and $L_{i+1,j_1}^1$ to be same as the sign of the right-to-left message which has the larger absolute value. If the sign of the right-to-left message which has the larger absolute value is negative, the both signs of the right-to-left messages $L_{i+1,j_0}^1$ and $L_{i+1,j_1}^1$ are changed to be negative. Also, if the sign of the right-to-left message which has the larger absolute value is positive, the both signs of the right-to-left messages $L_{i+1,j_0}^1$ and $L_{i+1,j_1}^1$ are changed to be positive.

Then in block 310, the receiver updates the second table, i.e. $L^1$ table, based on the updating of the conflict VPE. As the signs of the right-to-left messages $L_{i+1,j_0}^1$ and $L_{i+1,j_0}^1$ of the conflict VPE are changed, it would affect the right-to-left messages for the PE(s) at the right of the conflict VPE. In some embodiments, the receiver may update the right-to-left messages associated with the nodes of the PE(s) which is connected leftwards to the conflict VPE, without updating the right-to-left messages associated with the nodes of the PE(s) at the left of the conflict VPE. Thus, some right-to-left messages associated with the most-right nodes may be updated.

After the $L^1$ table is updated, the receiver may perform the BP decoding based on the updated $L^1$ table, as shown in block 312. The receiver may calculate $R^2$ table based on the updated $L^1$ table and then calculate $L^2$ table. Then the decoded information bits û may be decided from $L^2$ table. If the decoded information bits û pass the CRC, it indicates that the BP decoding is successful. If the decoded information bits û do not pass the CRC and iteration times do not exceed a preset maximum iteration time, the receiver may continue to perform the BP decoding. If the decoded information bits û do not pass the CRC and the iteration times exceed a preset maximum iteration time, or if the current L table is same as the previous L table and no decoded information bits û pass the CRC, the BP decoding will be considered as being unsuccessful.

Further, in some embodiments, if the BP decoding based on the updated $L^1$ table is unsuccessful, the receiver may search another conflict VPE, as described in block 306. If anther conflict VPE is found, the receiver may repeat the operations in block 308 and 310 to obtain a new updated $L^1$ table. Then the receiver may perform the BP decoding based on the new updated $L^1$ table.

If the BP decoding is unsuccessful and no other conflict VPE is found, the receiver may change the both signs of the right-to-left messages $L_{i+1,j_0}^1$ and $L_{i+1,j_1}^1$ of the found conflict VPE(s) again. The changed signs are still the same and opposite to the previous signs. For example, if the signs of the right-to-left messages $L_{i+1,j_0}^1$ and $L_{i+1,j_1}^1$ are changed to both negative in the first updating, this time the signs of the right-to-left messages $L_{i+1,j_0}^1$ and $L_{i+1,j_1}^1$ will be changed to both positive. Then the receiver may update the $L^1$ table again and perform the BP decoding based on the updated $L^1$ table. In the case where there are multiple conflict VPEs, the receiver may perform the changing of the signs of the right-to-left messages $L_{i+1,j_0}^1$ and $L_{i+1,j_1}^1$ for each of the multiple conflict VPEs. In an embodiment, the receiver may change the signs of the right-to-left messages $L_{i+1,j_0}^1$ and $L_{i+1,j_1}^1$ of one conflict VPE firstly, and then may update the $L^1$ table and perform the BP decoding. If the BP decoding is unsuccessful, the receiver may repeat the changing of the signs, the updating of the $L^1$ table and the BP decoding for another conflict VPE, until the BP decoding is successful or the signs of the right-to-left messages $L_{i+1,j_0}^1$ and $L_{i+1,j_1}^1$ of all the conflict VPEs are changed.

Please note that the order for performing the steps as shown in FIG. 3 is illustrated only as an example. In some implementation, some steps may be performed in a reverse order or in parallel. In some other implementation, some steps may be omitted or combined.

The various blocks shown in FIG. 3 may be viewed as method steps, and/or as operations that result from operation of computer program code, and/or as a plurality of coupled logic circuit elements constructed to carry out the associated function(s). The schematic flow chart diagrams described above are generally set forth as logical flow chart diagrams. As such, the depicted order and labeled steps are indicative of specific embodiments of the presented methods. Other steps and methods may be conceived that are equivalent in function, logic, or effect to one or more steps, or portions thereof, of the illustrated methods. Additionally, the order in which a particular method occurs may or may not strictly adhere to the order of the corresponding steps shown.

Figure 14:
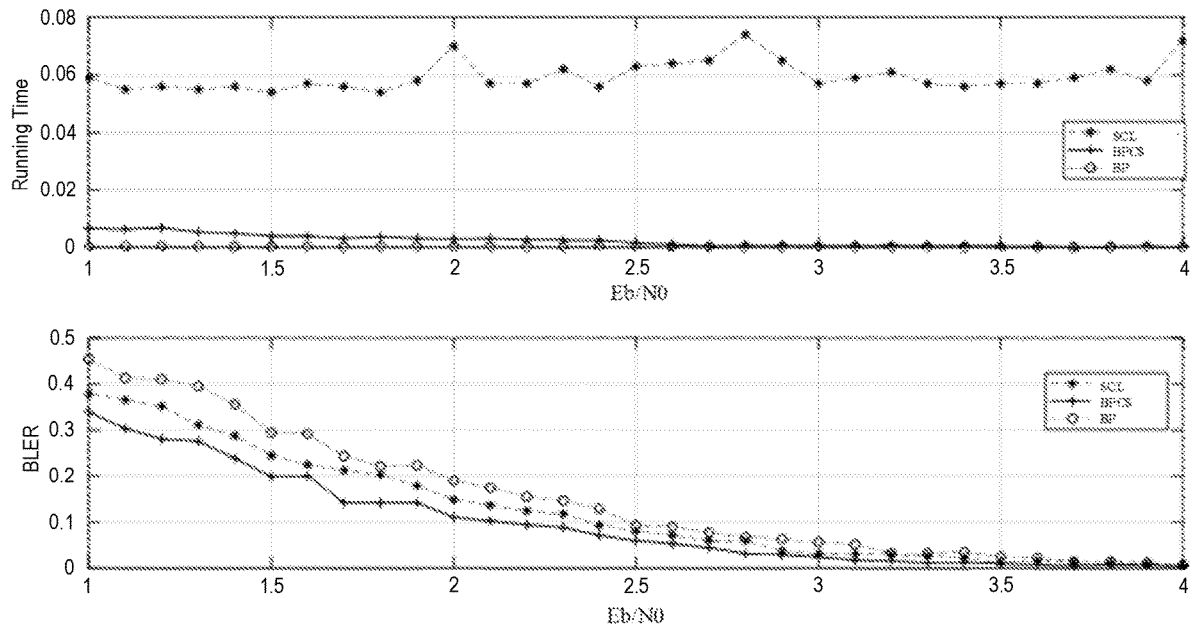
FIG. 14 is a diagram illustrating simulation results of running time and block error rate (BLER) for decoding 64 bit sequence.
Figure 15:
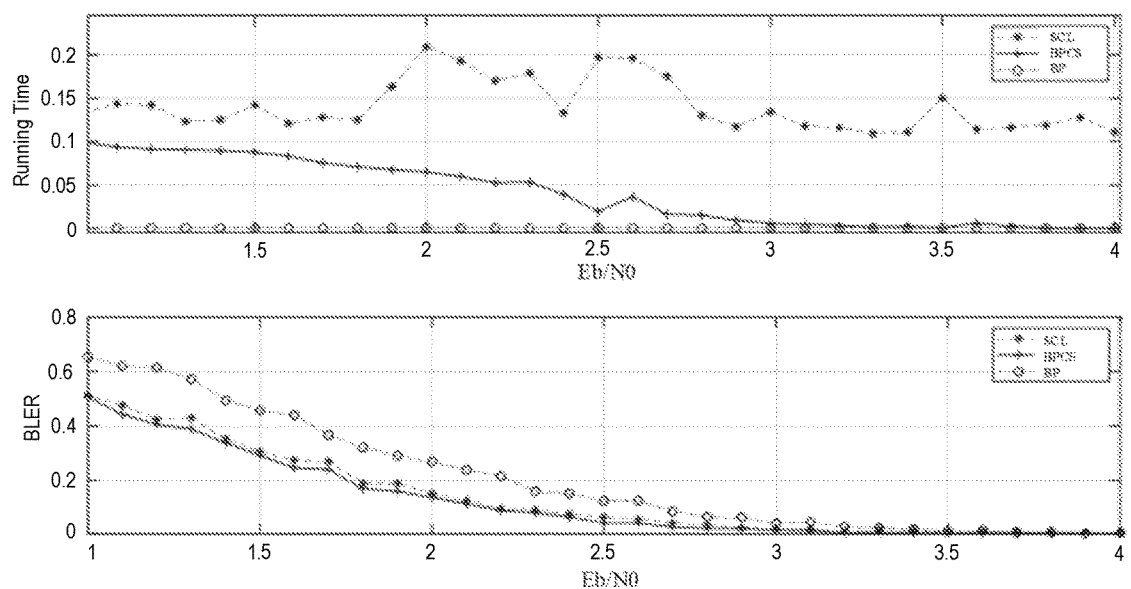
FIG. 15 is a diagram illustrating simulation results of running time and BLER for decoding 128 bit sequence.

FIGS. 14 and 15 illustrate simulation results of running time and block error rate (BLER) for decoding 64 bit sequence and 128 bit sequence, respectively, using the conventional BP decoding (denoted as "BP"), the SCL decoding (denoted as "SCL"), and the BPCS decoding (denoted as "BPCS") according to the embodiments of the present disclosure. It can be seen that, with respect to BLER, the BPCS decoding performs much better than the conventional BP decoding. With respect to the running time, as the simulations are serial running and parallel hardware design can achieve around 1/N of serial running time, the decoding latency of the BPCS decoding is lower than that of the SCL decoding obviously.

Figure 6:
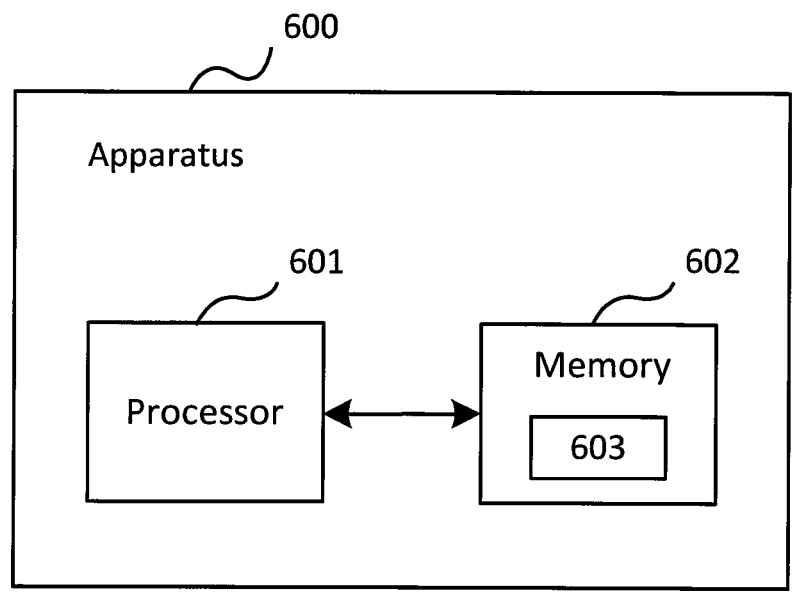
FIG. 6 is a block diagram illustrating an apparatus according to some embodiments of the present disclosure.

FIG. 6 is a block diagram illustrating an apparatus 600 according to various embodiments of the present disclosure. As shown in FIG. 6, the apparatus 600 may comprise one or more processors such as processor 601 and one or more memories such as memory 602 storing computer program codes 603. The memory 602 may be non-transitory machine/processor/computer readable storage medium. In accordance with some exemplary embodiments, the apparatus 600 may be implemented as an integrated circuit chip or module that can be plugged or installed into the receiver as described with respect to FIG. 3.

In some implementations, the one or more memories 602 and the computer program codes 603 may be configured to, with the one or more processors 601, cause the apparatus 600 at least to perform any operation of the method as described in connection with FIG. 3. In such embodiments, the apparatus 600 may be implemented as at least part of or communicatively coupled to the receiver as described above. As a particular example, the apparatus 600 may be implemented as a receiver.

Alternatively or additionally, the one or more memories 602 and the computer program codes 603 may be configured to, with the one or more processors 601, cause the apparatus 600 at least to perform more or less operations to implement the proposed methods according to the exemplary embodiments of the present disclosure.

Figure 7:
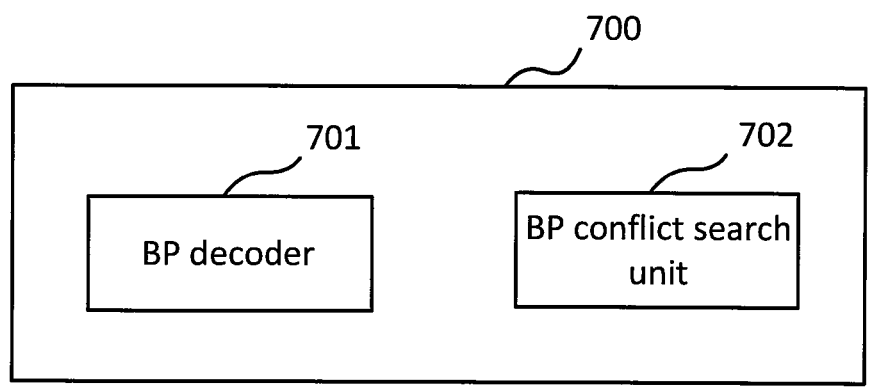
FIG. 7 is a block diagram illustrating an apparatus according to some embodiments of the present disclosure.

FIG. 7 is a block diagram illustrating an apparatus 700 according to some embodiments of the present disclosure. As shown in FIG. 7, the apparatus 700 may comprise a BP decoder 701 and a BP conflict search unit 702. In an exemplary embodiment, the apparatus 700 may be implemented in a receiver. The receiver may be implemented in a terminal device such as UE or a network node such as gNB. The BP decoder 701 may be configured to carry out the operation in block 302. The BP conflict search unit 602 may be configured to carry out the operations in blocks 304, 306, 308 and 310. Optionally, the BP decoder 701 and/or the BP conflict search unit 702 may be configured to carry out more or less operations to implement the proposed methods according to the exemplary embodiments of the present disclosure.

Figure 8:
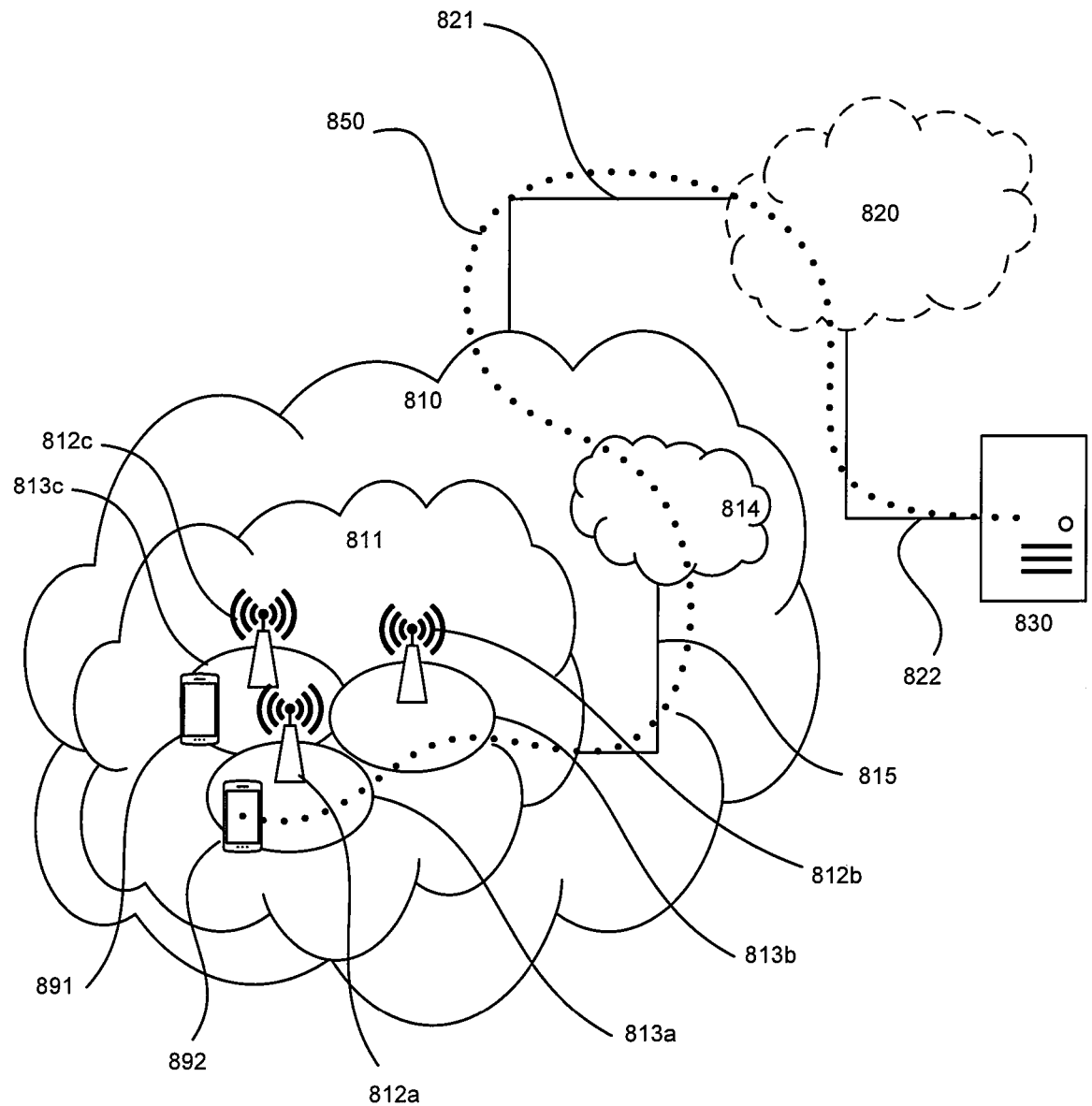
FIG. 8 is a block diagram illustrating a telecommunication network connected via an intermediate network to a host computer in accordance with some embodiments of the present disclosure.

FIG. 8 is a block diagram illustrating a telecommunication network connected via an intermediate network to a host computer in accordance with some embodiments of the present disclosure.

With reference to FIG. 8, in accordance with an embodiment, a communication system includes a telecommunication network 810, such as a 3GPP-type cellular network, which comprises an access network 811, such as a radio access network, and a core network 814. The access network 811 comprises a plurality of base stations 812a, 812b, 812c, such as NBs, eNBs, gNBs or other types of wireless access points, each defining a corresponding coverage area 813a, 813b, 813c. Each base station 812a, 812b, 812c is connectable to the core network 814 over a wired or wireless connection 815. A first UE 891 located in a coverage area 813c is configured to wirelessly connect to, or be paged by, the corresponding base station 812c. A second UE 892 in a coverage area 813a is wirelessly connectable to the corresponding base station 812a. While a plurality of UEs 891, 892 are illustrated in this example, the disclosed embodiments are equally applicable to a situation where a sole UE is in the coverage area or where a sole UE is connecting to the corresponding base station 812.

The telecommunication network 810 is itself connected to a host computer 830, which may be embodied in the hardware and/or software of a standalone server, a cloud-implemented server, a distributed server or as processing resources in a server farm. The host computer 830 may be under the ownership or control of a service provider, or may be operated by the service provider or on behalf of the service provider. Connections 821 and 822 between the telecommunication network 810 and the host computer 830 may extend directly from the core network 814 to the host computer 830 or may go via an optional intermediate network 820. An intermediate network 820 may be one of, or a combination of more than one of, a public, private or hosted network; the intermediate network 820, if any, may be a backbone network or the Internet; in particular, the intermediate network 820 may comprise two or more sub-networks (not shown).

The communication system of FIG. 8 as a whole enables connectivity between the connected UEs 891, 892 and the host computer 830. The connectivity may be described as an over-the-top (OTT) connection 850. The host computer 830 and the connected UEs 891, 892 are configured to communicate data and/or signaling via the OTT connection 850, using the access network 811, the core network 814, any intermediate network 820 and possible further infrastructure (not shown) as intermediaries. The OTT connection 850 may be transparent in the sense that the participating communication devices through which the OTT connection 850 passes are unaware of routing of uplink and downlink communications. For example, the base station 812 may not or need not be informed about the past routing of an incoming downlink communication with data originating from the host computer 830 to be forwarded (e.g., handed over) to a connected UE 891. Similarly, the base station 812 need not be aware of the future routing of an outgoing uplink communication originating from the UE 891 towards the host computer 830.

Figure 9:
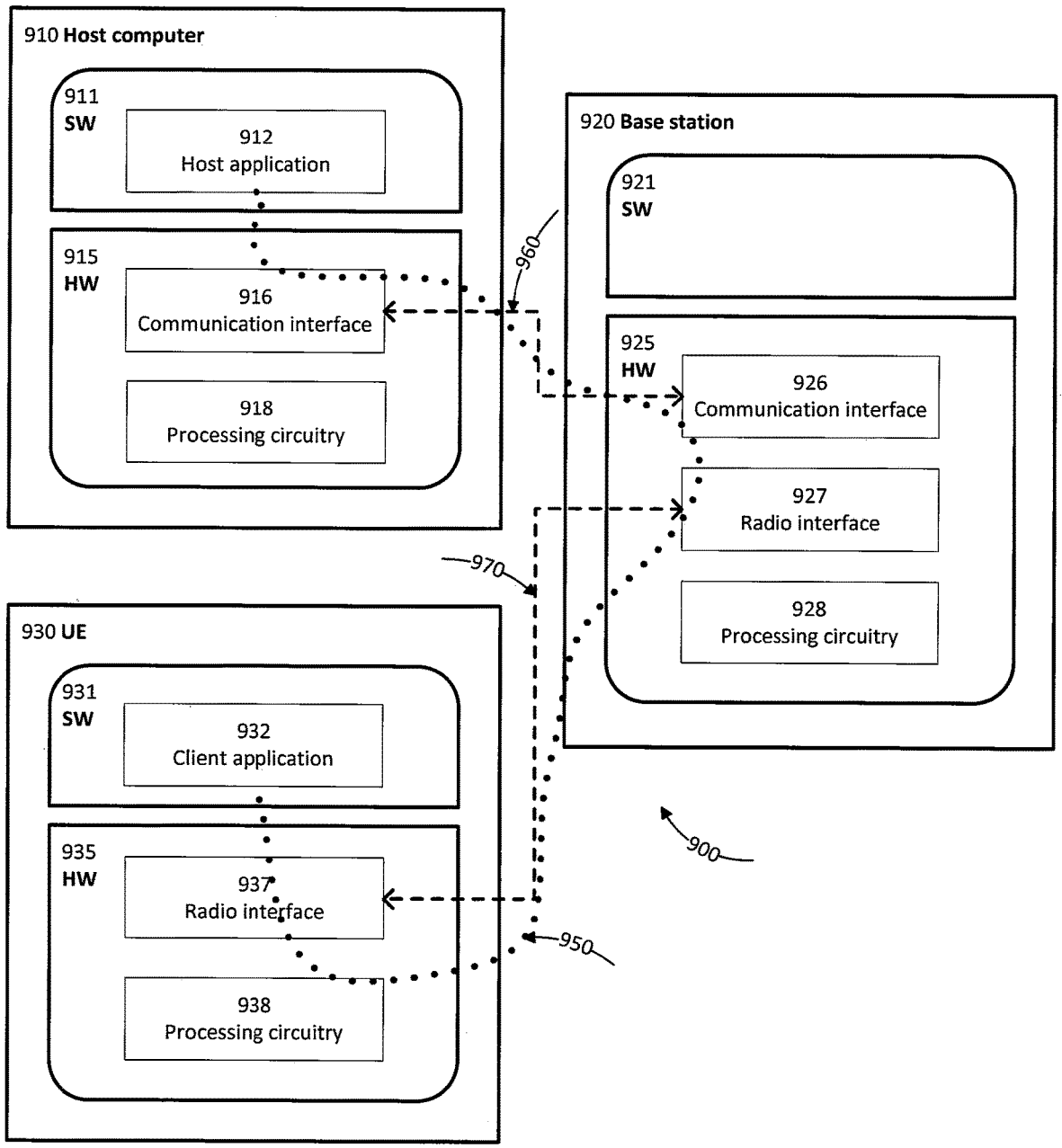
FIG. 9 is a block diagram illustrating a host computer communicating via a base station with a UE over a partially wireless connection in accordance with some embodiments of the present disclosure.

FIG. 9 is a block diagram illustrating a host computer communicating via a base station with a UE over a partially wireless connection in accordance with some embodiments of the present disclosure.

Example implementations, in accordance with an embodiment, of the UE, base station and host computer discussed in the preceding paragraphs will now be described with reference to FIG. 9. In a communication system 900, a host computer 910 comprises hardware 915 including a communication interface 916 configured to set up and maintain a wired or wireless connection with an interface of a different communication device of the communication system 900. The host computer 910 further comprises a processing circuitry 918, which may have storage and/or processing capabilities. In particular, the processing circuitry 918 may comprise one or more programmable processors, application-specific integrated circuits, field programmable gate arrays or combinations of these (not shown) adapted to execute instructions. The host computer 910 further comprises software 911, which is stored in or accessible by the host computer 910 and executable by the processing circuitry 918. The software 911 includes a host application 912. The host application 912 may be operable to provide a service to a remote user, such as UE 930 connecting via an OTT connection 950 terminating at the UE 930 and the host computer 910. In providing the service to the remote user, the host application 912 may provide user data which is transmitted using the OTT connection 950.

The communication system 900 further includes a base station 920 provided in a telecommunication system and comprising hardware 925 enabling it to communicate with the host computer 910 and with the UE 930. The hardware 925 may include a communication interface 926 for setting up and maintaining a wired or wireless connection with an interface of a different communication device of the communication system 900, as well as a radio interface 927 for setting up and maintaining at least a wireless connection 970 with the UE 930 located in a coverage area (not shown in FIG. 9) served by the base station 920. The communication interface 926 may be configured to facilitate a connection 960 to the host computer 910. The connection 960 may be direct or it may pass through a core network (not shown in FIG. 9) of the telecommunication system and/or through one or more intermediate networks outside the telecommunication system. In the embodiment shown, the hardware 925 of the base station 920 further includes a processing circuitry 928, which may comprise one or more programmable processors, application-specific integrated circuits, field programmable gate arrays or combinations of these (not shown) adapted to execute instructions. The base station 920 further has software 921 stored internally or accessible via an external connection.

The communication system 900 further includes the UE 930 already referred to. Its hardware 935 may include a radio interface 937 configured to set up and maintain a wireless connection 970 with a base station serving a coverage area in which the UE 930 is currently located. The hardware 935 of the UE 930 further includes a processing circuitry 938, which may comprise one or more programmable processors, application-specific integrated circuits, field programmable gate arrays or combinations of these (not shown) adapted to execute instructions. The UE 930 further comprises software 931, which is stored in or accessible by the UE 930 and executable by the processing circuitry 938. The software 931 includes a client application 932. The client application 932 may be operable to provide a service to a human or non-human user via the UE 930, with the support of the host computer 910. In the host computer 910, an executing host application 912 may communicate with the executing client application 932 via the OTT connection 950 terminating at the UE 930 and the host computer 910. In providing the service to the user, the client application 932 may receive request data from the host application 912 and provide user data in response to the request data. The OTT connection 950 may transfer both the request data and the user data. The client application 932 may interact with the user to generate the user data that it provides.

It is noted that the host computer 910, the base station 920 and the UE 930 illustrated in FIG. 9 may be similar or identical to the host computer 830, one of base stations 812*a*, 812*b*, 812*c* and one of UEs 891, 892 of FIG. 8, respectively. This is to say, the inner workings of these entities may be as shown in FIG. 9 and independently, the surrounding network topology may be that of FIG. 8.

In FIG. 9, the OTT connection 950 has been drawn abstractly to illustrate the communication between the host computer 910 and the UE 930 via the base station 920, without explicit reference to any intermediary devices and the precise routing of messages via these devices. Network infrastructure may determine the routing, which it may be configured to hide from the UE 930 or from the service provider operating the host computer 910, or both. While the OTT connection 950 is active, the network infrastructure may further take decisions by which it dynamically changes the routing (e.g., on the basis of load balancing consideration or reconfiguration of the network).

Wireless connection 970 between the UE 930 and the base station 920 is in accordance with the teachings of the embodiments described throughout this disclosure. One or more of the various embodiments improve the performance of OTT services provided to the UE 930 using the OTT connection 950, in which the wireless connection 970 forms the last segment. More precisely, the teachings of these embodiments may improve the latency and the power consumption, and thereby provide benefits such as lower complexity, reduced time required to access a cell, better responsiveness, extended battery lifetime, etc.

A measurement procedure may be provided for the purpose of monitoring data rate, latency and other factors on which the one or more embodiments improve. There may further be an optional network functionality for reconfiguring the OTT connection 950 between the host computer 910 and the UE 930, in response to variations in the measurement results. The measurement procedure and/or the network functionality for reconfiguring the OTT connection 950 may be implemented in software 911 and hardware 915 of the host computer 910 or in software 931 and hardware 935 of the UE 930, or both. In embodiments, sensors (not shown) may be deployed in or in association with communication devices through which the OTT connection 950 passes; the sensors may participate in the measurement procedure by supplying values of the monitored quantities exemplified above, or supplying values of other physical quantities from which the software 911, 931 may compute or estimate the monitored quantities. The reconfiguring of the OTT connection 950 may include message format, retransmission settings, preferred routing etc.; the reconfiguring need not affect the base station 920, and it may be unknown or imperceptible to the base station 920. Such procedures and functionalities may be known and practiced in the art. In certain embodiments, measurements may involve proprietary UE signaling facilitating the host computer 910's measurements of throughput, propagation times, latency and the like. The measurements may be implemented in that the software 911 and 931 causes messages to be transmitted, in particular empty or 'dummy' messages, using the OTT connection 950 while it monitors propagation times, errors etc.

Figure 10:
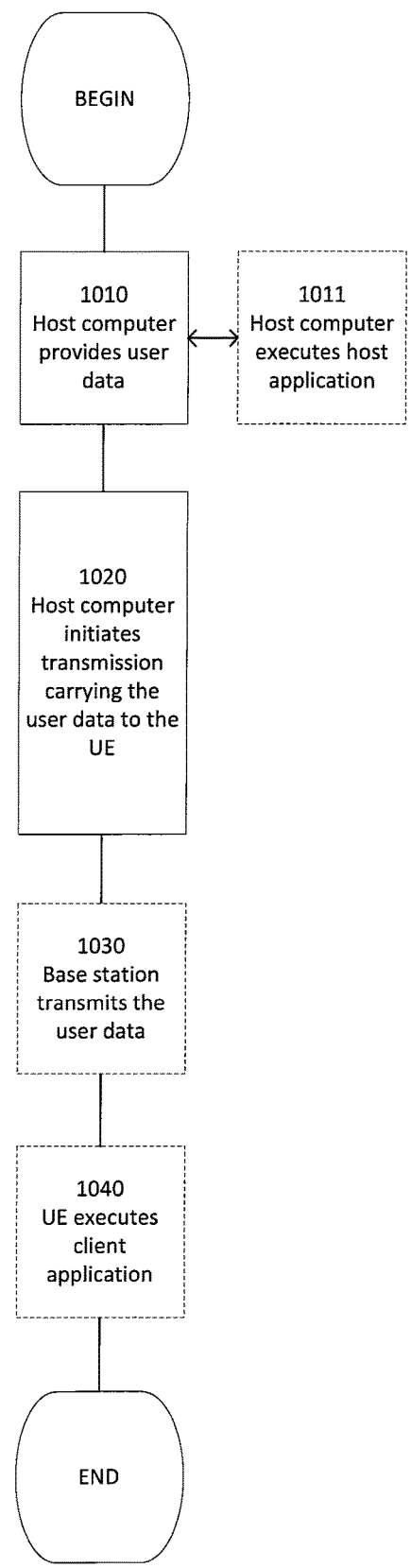
FIG. 10 is a flowchart illustrating a method implemented in a communication system, in accordance with an embodiment of the present disclosure.

FIG. 10 is a flowchart illustrating a method implemented in a communication system, in accordance with an embodiment. The communication system includes a host computer, a base station and a UE which may be those described with reference to FIG. 8 and FIG. 9. For simplicity of the present disclosure, only drawing references to FIG. 10 will be included in this section. In step 1010, the host computer provides user data. In substep 1011 (which may be optional) of step 1010, the host computer provides the user data by executing a host application. In step 1020, the host computer initiates a transmission carrying the user data to the UE. In step 1030 (which may be optional), the base station transmits to the UE the user data which was carried in the transmission that the host computer initiated, in accordance with the teachings of the embodiments described throughout this disclosure. In step 1040 (which may also be optional), the UE executes a client application associated with the host application executed by the host computer.

Figure 11:
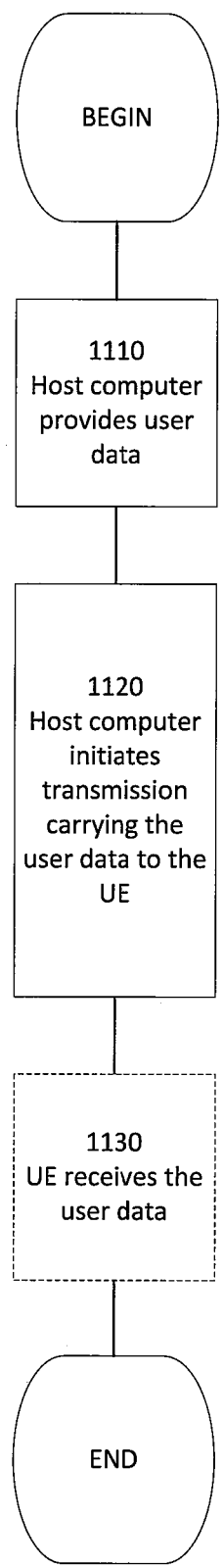
FIG. 11 is a flowchart illustrating a method implemented in a communication system, in accordance with an embodiment of the present disclosure.

FIG. 11 is a flowchart illustrating a method implemented in a communication system, in accordance with an embodiment. The communication system includes a host computer, a base station and a UE which may be those described with reference to FIG. 8 and FIG. 9. For simplicity of the present disclosure, only drawing references to FIG. 11 will be included in this section. In step 1110 of the method, the host computer provides user data. In an optional substep (not shown) the host computer provides the user data by executing a host application. In step 1120, the host computer initiates a transmission carrying the user data to the UE. The transmission may pass via the base station, in accordance with the teachings of the embodiments described throughout this disclosure. In step 1130 (which may be optional), the UE receives the user data carried in the transmission.

Figure 12:
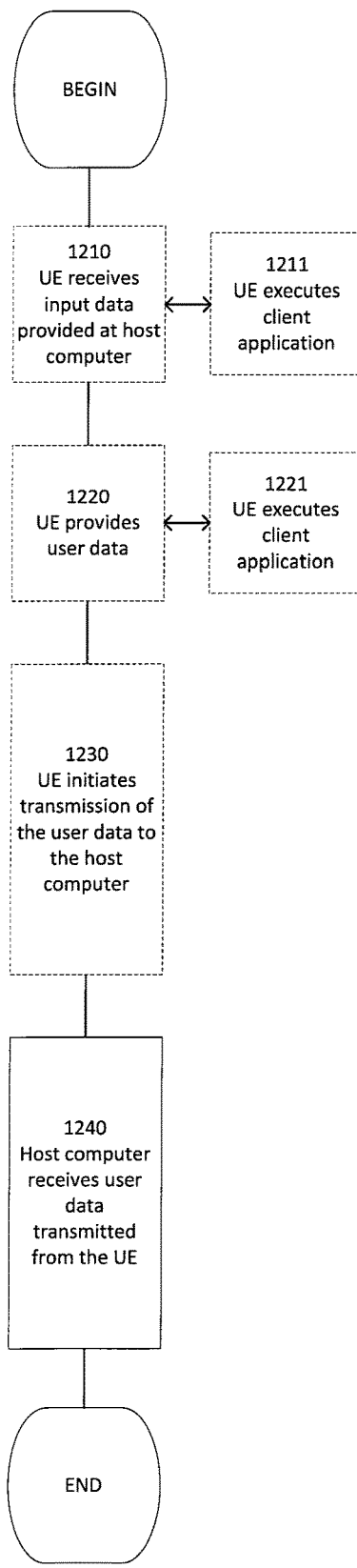
FIG. 12 is a flowchart illustrating a method implemented in a communication system, in accordance with an embodiment of the present disclosure.

FIG. 12 is a flowchart illustrating a method implemented in a communication system, in accordance with an embodiment. The communication system includes a host computer, a base station and a UE which may be those described with reference to FIG. 8 and FIG. 9. For simplicity of the present disclosure, only drawing references to FIG. 12 will be included in this section. In step 1210 (which may be optional), the UE receives input data provided by the host computer. Additionally or alternatively, in step 1220, the UE provides user data. In substep 1221 (which may be optional) of step 1220, the UE provides the user data by executing a client application. In substep 1211 (which may be optional) of step 1210, the UE executes a client application which provides the user data in reaction to the received input data provided by the host computer. In providing the user data, the executed client application may further consider user input received from the user. Regardless of the specific manner in which the user data was provided, the UE initiates, in substep 1230 (which may be optional), transmission of the user data to the host computer. In step 1240 of the method, the host computer receives the user data transmitted from the UE, in accordance with the teachings of the embodiments described throughout this disclosure.

Figure 13:
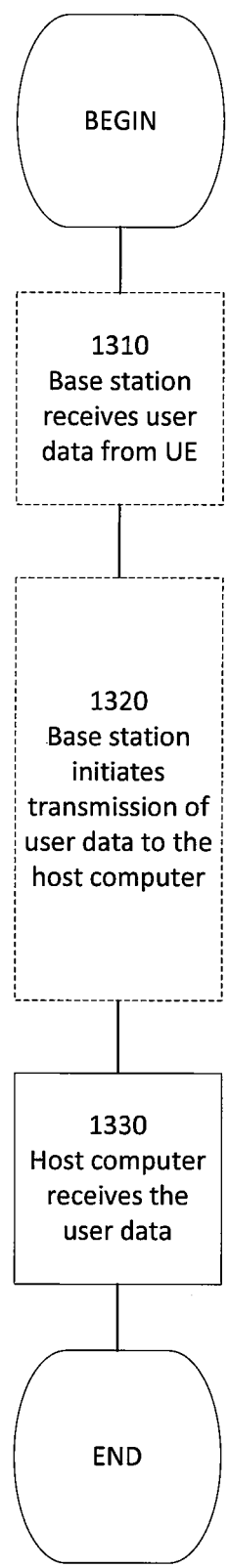
FIG. 13 is a flowchart illustrating a method implemented in a communication system, in accordance with an embodiment of the present disclosure.

FIG. 13 is a flowchart illustrating a method implemented in a communication system, in accordance with an embodiment. The communication system includes a host computer, a base station and a UE which may be those described with reference to FIG. 8 and FIG. 9. For simplicity of the present disclosure, only drawing references to FIG. 13 will be included in this section. In step 1310 (which may be optional), in accordance with the teachings of the embodiments described throughout this disclosure, the base station receives user data from the UE. In step 1320 (which may be optional), the base station initiates transmission of the received user data to the host computer. In step 1330 (which may be optional), the host computer receives the user data carried in the transmission initiated by the base station.

In general, the various exemplary embodiments may be implemented in hardware or special purpose chips, circuits, software, logic or any combination thereof. For example, some aspects may be implemented in hardware, while other aspects may be implemented in firmware or software which may be executed by a controller, microprocessor or other computing device, although the disclosure is not limited thereto. While various aspects of the exemplary embodiments of this disclosure may be illustrated and described as block diagrams, flow charts, or using some other pictorial representation, it is well understood that these blocks, apparatus, systems, techniques or methods described herein may be implemented in, as non-limiting examples, hardware, software, firmware, special purpose circuits or logic, general purpose hardware or controller or other computing devices, or some combination thereof.

As such, it should be appreciated that at least some aspects of the exemplary embodiments of the disclosure may be practiced in various components such as integrated circuit chips and modules. It should thus be appreciated that the exemplary embodiments of this disclosure may be realized in an apparatus that is embodied as an integrated circuit, where the integrated circuit may comprise circuitry (as well as possibly firmware) for embodying at least one or more of a data processor, a digital signal processor, baseband circuitry and radio frequency circuitry that are configurable so as to operate in accordance with the exemplary embodiments of this disclosure.

It should be appreciated that at least some aspects of the exemplary embodiments of the disclosure may be embodied in computer-executable instructions, such as in one or more program modules, executed by one or more computers or other devices. Generally, program modules include routines, programs, objects, components, data structures, etc. that perform particular tasks or implement particular abstract data types when executed by a processor in a computer or other device. The computer executable instructions may be stored on a computer readable medium such as a hard disk, optical disk, removable storage media, solid state memory, random access memory (RAM), etc. As will be appreciated by one of skill in the art, the function of the program modules may be combined or distributed as desired in various embodiments. In addition, the function may be embodied in whole or partly in firmware or hardware equivalents such as integrated circuits, field programmable gate arrays (FPGA), and the like.

The present disclosure includes any novel feature or combination of features disclosed herein either explicitly or any generalization thereof. Various modifications and adaptations to the foregoing exemplary embodiments of this disclosure may become apparent to those skilled in the relevant arts in view of the foregoing description, when read in conjunction with the accompanying drawings. However, any and all modifications will still fall within the scope of the non-limiting and exemplary embodiments of this disclosure.

What is claimed is:

1. A method performed by a receiver, comprising:
   performing belief propagation, BP, decoding on received information;
   obtaining, in response to the BP decoding being unsuccessful and based on a first table comprising left-to-right messages associated with nodes of a plurality of processing elements for the BP decoding and the received information, a second table comprising right-to-left messages associated with the nodes;
   searching, based on the first table and the second table, a conflict verification processing element in the plurality of processing elements, the conflict verification processing element being a verification processing element for which the left-to-right messages associated with the most-left nodes affecting the left-to-right message associated with its left-upper node indicate frozen bits and the left-to-right messages associated with the most-left nodes affecting the left-to-right message associated with its left-lower node indicate frozen bits and information bits, and having a negative sign for the right-to-left message associated with its left-upper node;
   updating, for the conflict verification processing element, both signs of the right-to-left messages associated with its right-upper node and right-lower node to be the same and the sign of the right-to-left messages associated with its left-upper node to be positive;
   updating the second table based on the updating of the conflict verification processing element; and
   performing the BP decoding based on the updated second table.

2. The method according to claim 1, further comprising:
   searching, in response to the BP decoding based on the updated second table being unsuccessful, another conflict verification processing element.

3. The method according to claim 2, further comprising:
   changing, in response to the BP decoding based on the updated second table being unsuccessful and no other conflict verification processing element being found, the both signs of the right-to-left messages associated with the right-upper node and right-lower node of at least one conflict verification processing element; and
   wherein the changed signs are the same and opposite to the signs before the changing.

4. The method according to claim 1, wherein the left-to-right message and the right-to-left message are in the form of logarithmic likelihood ratio, LLR.

5. The method according to claim 4, wherein the left-to-right message in the first table is calculated as follows:

$$R_{i+1,j,0}=f(R_{i,j,2},R_{i,j,3}),$$

$$R_{i+1,j,1}=R_{i,j,3},$$

$$f(a,b)=\mathrm{sign}(a*b)*\min(|a|,|b|),$$

where $R_{i+1,j,0}$ represents the left-to-right message associated with the right-upper node of the processing element, $R_{i+1,j,1}$ represents the left-to-right message associated with the right-lower node of the processing element, $R_{i,j,2}$ represents the left-to-right message associated with the left-upper node of the processing element, and $R_{i,j,3}$ represents the left-to-right message associated with the left-lower node of the processing element, and
   wherein the left-to-right messages associated with the most-left nodes are set based on bit positions of information bits and frozen bits in a source bit sequence from which the received information is originated, wherein the left-to-right message associated with the most-left node indicating the information bit is set to a first value and the left-to-right message associated with the most-left node indicating the frozen bit is set to a second value.

6. The method according to claim 5, wherein the right-to-left message in the second table is calculated as follows:

$$L_{i,j,2}=f(R_{i,j,3}+L_{i+1,j,1},L_{i+1,j,0}),$$

$$L_{i,j,3}=f(R_{i,j,2},L_{i+1,j,0})+L_{i+1,j,1},$$

$$f(a,b)=\mathrm{sign}(a*b)*\min(|a|,|b|),$$

where $L_{i,j,2}$ represents the right-to-left message associated with the left-upper node of the processing element, $L_{i,j,3}$ represents the right-to-left message associated with the left-lower node of the processing element, $L_{i+1,j,0}$ represents the right-to-left message associated with the right-upper node of the processing element, and $L_{i+1,j,1}$ represents the right-to-left message associated with the right-lower node of the processing element, and
   wherein the right-to-left messages associated with the most-right nodes are set to the received information.

7. The method according to claim 4, wherein searching the conflict verification processing element in the plurality of processing elements comprises:
   checking, for each of the plurality processing elements based on the first table, the left-to-right messages associated with the left-upper node and the left-lower node;
   determining the processing element of which the left-to-right message associated with its left-upper node has a larger value than the left-to-right message associated with its left-lower node as the verification processing element;
   checking, for the verification processing element based on the second table, whether the right-to-left message associated with the left-upper node has a negative sign; and determining, in response to the right-to-left message associated with the left-upper node having the negative sign, the verification processing element as the conflict verification processing element.

8. The method according to claim 7, wherein the searching of the conflict verification processing element is performed starting from the most-right processing element.

9. The method according to claim 4, wherein updating, for the conflict verification processing element, both signs of the right-to-left messages associated with its right-upper node and right-lower node to be the same and the sign of the right-to-left messages associated with its left-upper node to be positive comprises:
 comparing absolute values of the right-to-left messages associated with the right-upper node and right-lower node of the conflict verification processing element;
 changing the both signs of the right-to-left messages associated with the right-upper node and right-lower node of the conflict verification processing element to be same as the sign of the right-to-left message which has the larger absolute value; and
 changing the sign of the right-to-left messages associated with its left-upper node to be positive.

10. The method according to claim 1, wherein updating the second table based on the updating of the conflict verification processing element comprises:
 updating the right-to-left messages associated with the nodes of the processing elements which are connected leftwards to the conflict verification processing element.

11. A receiver comprising:
one or more processors; and
one or more memories comprising computer program codes,
the one or more memories and the computer program codes configured to, with the one or more processors, cause the receiver to:
 perform belief propagation, BP, decoding on received information;
 obtain, in response to the BP decoding being unsuccessful and based on a first table comprising left-to-right messages associated with nodes of a plurality of processing elements for the BP decoding and the received information, a second table comprising right-to-left messages associated with the nodes;
 search, based on the first table and the second table, a conflict verification processing element in the plurality of processing elements, the conflict verification processing element being a verification processing element for which the left-to-right messages associated with the most-left nodes affecting the left-to-right message associated with its left-upper node indicate frozen bits and the left-to-right messages associated with the most-left nodes affecting the left-to-right message associated with its left-lower node indicate frozen bits and information bits, and having a negative sign for the right-to-left message associated with its left-upper node;
 update, for the conflict verification processing element, both signs of the right-to-left messages associated with its right-upper node and right-lower node to be the same and the sign of the right-to-left messages associated with its left-upper node to be positive;
 update the second table based on the updating of the conflict verification processing element; and
 perform the BP decoding based on the updated second table.

* * * * *